US012738953B2

(12) United States Patent
Han et al.

(10) Patent No.: US 12,738,953 B2
(45) Date of Patent: Sep. 15, 2026

(54) ANALOG-TO-DIGITAL CONVERTER

(71) Applicant: IUCF-HYU (INDUSTRY-UNIVERSITY COOPERATION FOUNDATION HANYANG UNIVERSITY), Seoul (KR)

(72) Inventors: Jaeduk Han, Seoul (KR); Eunsang Lee, Seoul (KR); Sanghun Lee, Seoul (KR); Changhyun Pyo, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 163 days.

(21) Appl. No.: 18/734,347

(22) Filed: Jun. 5, 2024

(65) Prior Publication Data

US 2025/0007530 A1 Jan. 2, 2025

(30) Foreign Application Priority Data

Jun. 29, 2023 (KR) ........................ 10-2023-0084499
Apr. 29, 2024 (KR) ........................ 10-2024-0056704

(51) Int. Cl.
*H03M 1/46* (2006.01)
*H03M 1/06* (2006.01)
*H03M 1/12* (2006.01)

(52) U.S. Cl.
CPC ......... *H03M 1/466* (2013.01); *H03M 1/0675* (2013.01); *H03M 1/0678* (2013.01);
(Continued)

(58) Field of Classification Search
CPC .... H03M 1/466; H03M 1/462; H03M 1/0685; H03M 1/0675; H03M 1/0678; H03M 1/0697; H03M 1/125
See application file for complete search history.

(56) References Cited

U.S. PATENT DOCUMENTS 7,205,921 B1 * 4/2007 Savla .................... H03M 1/145 341/163
10,454,491 B1 * 10/2019 Ghittori .................. H03M 9/00
(Continued)

FOREIGN PATENT DOCUMENTS

KR 10-2012-0065806 A 6/2012
KR 10-2016-0058140 A 5/2016
KR 10-2362737 B1 2/2022

OTHER PUBLICATIONS

Lee et al., "A 1.5-GS/s 6-bit Single-Channel Loop-Unrolled SAR ADC With Speculative CDAC Switching Control Technique in 28-nm CMOS", IEEE Transactions on Circuits and Systems-I: Regular Papers, vol. 69, No. 10, Oct. 2022, pp. 3954-3964.
(Continued)

*Primary Examiner* — Khai M Nguyen
(74) *Attorney, Agent, or Firm* — Sughrue Mion, PLLC

(57) ABSTRACT

An analog-to-digital converter (ADC) using a plurality of capacitor digital-to-analog converters (CDACs) includes a plurality of comparators, a plurality of CDACs each configured to generate a reference voltage, and a switch circuit configured to connect one CDAC among the plurality of CDACs to an n+1 comparator, based on a digital value output from an n comparator among the plurality of comparators, and the n+1 comparator may output a digital value based on a result of comparing the reference voltage of one CDAC among the plurality of CDACs with an input voltage.

14 Claims, 8 Drawing Sheets

(52) U.S. Cl.
CPC ......... *H03M 1/0697* (2013.01); *H03M 1/125* (2013.01); *H03M 1/462* (2013.01); *H03M 1/0685* (2013.01)

(56) References Cited

U.S. PATENT DOCUMENTS

| | | | |
|---|---|---|---|
| 10,812,098 | B1 | 10/2020 | Vishweshwara et al. |
| 2012/0146830 | A1 | 6/2012 | Jeon et al. |
| 2015/0077280 | A1 | 3/2015 | Park et al. |
| 2019/0190531 | A1 | 6/2019 | Martens et al. |
| 2022/0407532 | A1 | 12/2022 | Yonar et al. |

OTHER PUBLICATIONS

Jara et al., “A 6-bit 10-GS/s 17.6-mW CMOS ADC with 0.8-V supply”, 2023 IEEE Custom Integrated Circuits Conference (CICC), 2023, pp. 1-2, DOI: 10.1109/CICC57935.2023.10121287.

Extended European Search Report issued Nov. 22, 2024 in Application No. 24179703.4.

* cited by examiner

ANALOG-TO-DIGITAL CONVERTER

CROSS-REFERENCE TO RELATED APPLICATION

This application is based on and claims priority under 35 U.S.C. § 119 to Korean Patent Application Nos. 10-2023-0084499, filed on Jun. 29, 2023, and 10-2024-0056704, filed on Apr. 29, 2024, in the Korean Intellectual Property Office, the disclosures of which are incorporated by reference herein in their entireties.

BACKGROUND

1. Field

The disclosure relates to an analog-digital converter (ADC), and more particularly, to an ADC capable of reducing the time required for analog-digital conversion by previously calculating available digital-to-analog converter (DAC) setting values and starting DAC setting before an output of a comparator is generated. This research has been conducted with support from the Samsung Future Technology Promotion Project (Project Number: SRFC-IT2001-02).

2. Description of the Related Art

An analog-digital converter (ADC), which is an electronic circuit that performs a process of converting analog signals into digital signals, is a circuit that converts analog input signals measured by a sensor into digital signals that may be interpreted by electronic devices such as computers and outputs the digital signals.

Analog signals have continuous values and change continuously over time. For example, a voice signal input from a microphone or a temperature value measured by a temperature sensor are analog signals. In contrast, digital signals have discrete values of 0 and 1.

In general, ADCs may perform operations of sampling and quantizing analog input signals. Sampling is a process of extracting analog signals at regular time intervals, and quantization is a process of approximating extracted samples to close digital values.

In particular, among these ADCs, a successive approximation register (SAR) ADC is the most commonly used ADC architecture.

The SAR ADC may include a sample and hold circuit that samples an input signal and stores the input signal for a certain period of time, a bit determining circuit that performs bit determination by using a register set called an SAR, estimates an ADC input value at the current bit position, and generates an analog estimation signal by using a capacitor digital-to-analog converter (CDAC), and a comparator that compares the analog signal estimated by the bit determining circuit with the input signal and records a comparison result in the SAR register. At this time, the CDAC is mainly implemented as a circuit that generates an analog signal corresponding to an input digital code by using a capacitor, but may also be implemented as a different type of DAC.

These SAR ADCs may be divided into asynchronous SAR ADCs that use repetitive loops to determine bits, and loop-unrolled SAR ADCs that have an unfolded structure without using repetitive loops.

However, in the case of the SAR ADC of the related art, there is a problem that the overall cycle time increases because time to reset one comparator is required as values of multiple bits are determined with one comparator, or CDAC setting time is required even when a plurality of comparators are used, which has the disadvantage of increasing the analog-to-digital conversion time of the entire circuit.

SUMMARY

The disclosure provides an analog-to-digital converter (ADC) using a plurality of digital-to-analog converters (DACs) capable of implementing a faster operation speed by enabling DAC settings before a comparator output value is determined, thereby reducing the analog-to-digital conversion time.

Additional aspects will be set forth in part in the description which follows and, in part, will be apparent from the description, or may be learned by practice of the presented embodiments of the disclosure.

According to an aspect of the disclosure, an analog-to-digital converter (ADC) using a plurality of capacitor digital-to-analog converters (CDACs) includes a plurality of comparators, a plurality of CDACs each configured to generate a reference voltage, and a switch circuit configured to connect one CDAC among the plurality of CDACs to an n+1 comparator, based on a digital value output from an n comparator among the plurality of comparators, and the n+1 comparator may output a digital value based on a result of comparing the reference voltage of one CDAC among the plurality of CDACs with an input voltage.

The ADC may further include a logic circuit configured to sample a digital value output from an n−1 comparator among the plurality of comparators, and the plurality of CDACs each may generate the reference voltage, based on the sampled digital value.

The logic circuit may include a plurality of successive approximation register (SAR) logic circuits, and the plurality of SAR logic circuits may sample the digital value output from the n−1 comparator, and transfer the sampled digital value to the plurality of CDACs respectively connected to the plurality of SAR logic circuits.

The logic circuit may include a storage unit storing the sampled digital value, and the storage unit may be connected to the plurality of SAR logic circuits.

The plurality of CDACs may include a first CDAC configured to generate a first reference voltage when the digital value output from the n comparator is expected to be 1, based on the sampled digital value, and a second CDAC configured to generate a second reference voltage when the digital value output from the n comparator is expected to be 0, based on the sampled digital value.

The switch circuit may transfer the first reference voltage of the first CDAC to the n+1 comparator when the digital value output from the n comparator is 1, and transfer the second reference voltage of the second CDAC to the n+1 comparator when the digital value output from the n comparator is 0.

The plurality of CDACs may generate the respective reference voltages before the digital value is output from the n comparator.

The plurality of CDACs may be connected to each other in parallel.

The ADC may further include at least one clock generator configured to generate a clock with respect to each of the plurality of comparators.

The n comparator may be a comparator configured to operate in a current step, the n−1 comparator may be a comparator configured to operate in a step previous to the current step, and the n+1 comparator may be a comparator configured to operate in a step subsequent to the current step.

According to another aspect of the disclosure, an ADC using a plurality of CDACs includes a plurality of comparators, a first CDAC configured to generate a first reference voltage based on a digital value output from an n−1 comparator among the plurality of comparators, a second CDAC configured to generate a second reference voltage based on the digital value output from the n−1 comparator among the plurality of comparators, and a switch circuit configured to connect the first CDAC or the second CDAC to an n+1 comparator based on a digital value output from an n comparator among the plurality of comparators, and the n+1 comparator may output a digital value based on a result of comparing the first reference voltage or the second reference voltage with an input voltage.

The ADC may further include a logic circuit configured to sample the digital value output from the n−1 comparator, and the first reference voltage or the second reference voltage may be generated based on the sampled digital value.

The switch circuit may transfer the first reference voltage of the first CDAC to the n+1 comparator when the digital value output from the n comparator is 1, and transfer the second reference voltage of the second CDAC to the n+1 comparator when the digital value output from the n comparator is 0.

The first CDAC may generate the first reference voltage, and the second CDAC may generate the second reference voltage before the digital value is output from the n comparator.

The first CDAC and the second CDAC may be connected to each other in parallel.

The ADC may further include a CDAC configured to generate and output a reference voltage compared with an input voltage, a comparator configured to receive the input voltage and the reference voltage output by the CDAC, and output a digital value based on a result of comparing the input voltage with the reference voltage, and a SAR logic circuit storing the digital value output by the comparator, and configured to transmit the stored digital value to the CDAC.

The ADC may further include a comparator configured to compare an input voltage with a reference voltage and output a digital value in a current step, a first CDAC configured to generate and output a reference voltage required when an output of the comparator is 1, a second CDAC configured to generate and output a reference voltage required when the output of the comparator is 0, and a SAR logic circuit storing a digital value output by the comparator in a previous step and transmit the stored digital value to the first CDAC and the second CDAC.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
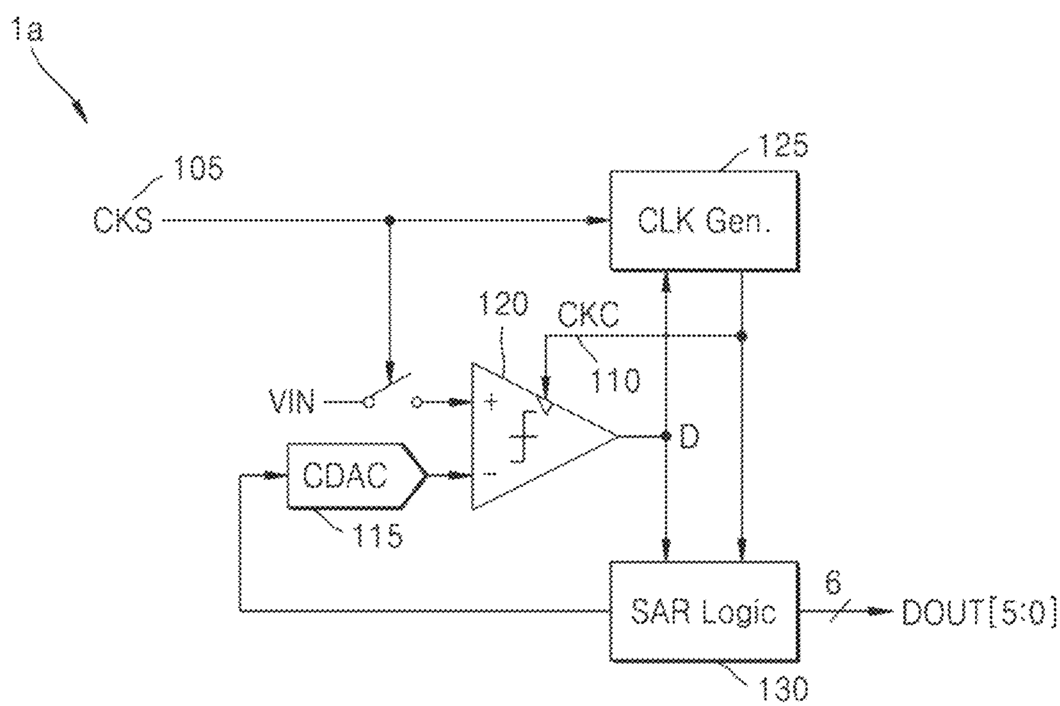
FIG. 1 is a diagram illustrating a structure of an asynchronous a successive approximation register (SAR) analog-digital converter (ADC)

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The embodiments described herein and components illustrated in the drawings are merely preferred examples of the disclosure, and many variations may be made therein to substitute for the embodiments and drawings described herein at the time of filing of this application.

In addition, the same reference numbers or symbols shown in each drawing herein indicate components or elements that perform substantially the same function.

The terms used herein are for the purpose of describing an embodiment and is not intended to limit the disclosure. Singular expressions used herein are intended to include plural expressions as well unless the context clearly indicates otherwise.

The terms such as "comprise," "include," or "have" used herein are intended to specify the presence of stated features, numbers, steps, operations, elements, components, or combinations thereof, but do not preclude the presence or addition of one or more other features, numbers, steps, operations, elements, components, or combinations thereof.

Although the terms including an ordinal number such as "first", "second", etc. may be used herein to describe various elements or components, these elements or components should not be limited by the terms, and the terms are only used to distinguish one element or component from another element or component.

For example, as used herein, a first element or component may be termed a second element or component without departing from the scope of the disclosure, and similarly, a second element or component may be termed a first element or component. The term "and/or" includes any combination of a plurality of related stated items or any of the plurality of related stated items.

Throughout the specification, it will be understood that when a part is referred to as being "connected" or "coupled" to another part, it may be directly connected to or indirectly coupled to the other part, and the indirect connection includes a connection via a wireless communication network.

Furthermore, terms such as "portion", "device", "block", "member", and "module" used herein may refer to a unit for processing at least one function or operation. For example, the terms may denote at least one hardware element such as a field-programmable gate array (FPGA) or an application-specific integrated circuit (ASIC), at least one software stored in a memory, or at least one process processed by a processor.

Hereinafter, embodiments according to the disclosure will be described in detail with reference to the attached drawings.

FIG. 1 is a diagram illustrating a structure of an asynchronous a successive approximation register (SAR) analog-digital converter (ADC) 1a.

Referring to FIG. 1, the asynchronous SAR ADC 1a may include a switch to sample an input voltage VIN, a capacitor digital-to-analog converter (CDAC) 115 generating a reference voltage to be compared with the input voltage VIN for each cycle, a comparator 120 comparing the input voltage VIN with an output of the CDAC 115 and determining a digital value D, a clock generator CKC GEN 125 generating a clock of the comparator 120, and a SAR logic circuit 130 controlling switching of the CDAC 115 based on an output of the comparator 120.

A CKS 105 may be defined as a reference clock signal sampling the input voltage VIN of the asynchronous SAR ADC 1a and setting a clock generation time of an internal clock source generator. The asynchronous SAR ADC 1a may include at least one of an internal clock source or an external clock source. The internal clock source may be a clock generator (e.g., the clock generator CKC GEN 125) embedded inside the asynchronous SAR ADC 1a, and the external clock source may be outside the asynchronous SAR ADC 1a. The internal clock source may sample the input signal VIN for each sampling period through the CKS 105, and drive the internal clock generator to generate an internal clock for a digital conversion of the sampled analog input signal.

A CKC 110 output from the clock generator 125 is a signal controlling the clock period of the asynchronous SAR ADC 1a. The asynchronous SAR ADC 1a may perform a conversion operation according to the clock period, and set the clock period by using the CKC 110.

This clock period is related to an analog-to-digital conversion speed and may represent a period at which the asynchronous SAR ADC 1a samples an input signal and performs bit determining. For example, in an asynchronous structure, after the comparator 120 determines the output D, a falling edge of the CKC 110 may be generated, to reset the comparator 120 for a next comparison step. In addition, after the output of the comparator 120 is reset, a rising edge of the CKC 110 may be generated for an operation of the comparator 120 for a next bit.

The shorter the clock period controlled by the CKC 110, the faster the digital conversion speed, but this may affect the performance and power consumption of the asynchronous SAR ADC 1a. Accordingly, the asynchronous SAR ADC 1a may adjust the CKC 110 to achieve the desired conversion speed and performance.

The CKS 105 and the CKC 110 are important signals controlling the operation of the asynchronous SAR ADC 1a, and may be used to optimize the operation of the asynchronous SAR ADC 1a by appropriately setting a clock selection and the clock period.

Figure 2:
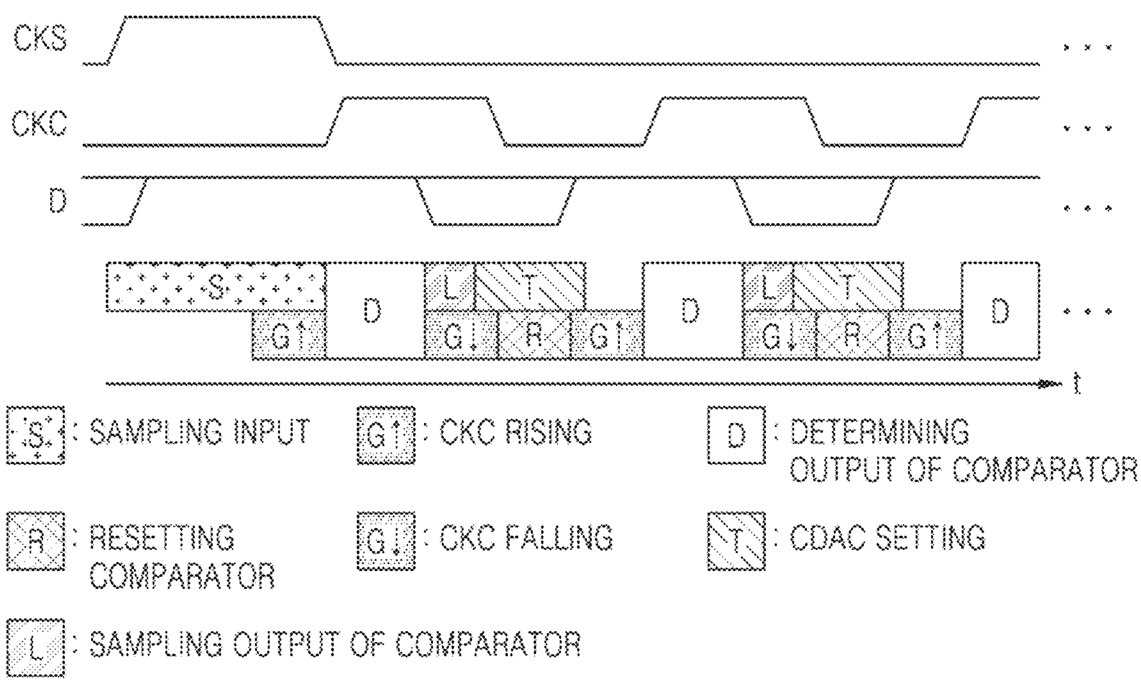
FIG. 2 is a diagram illustrating an operation process of the asynchronous SAR ADC over time.

FIG. 2 is a diagram illustrating an operation process of an asynchronous SAR ADC over time.

Referring to FIG. 2, an operation of sampling S may be performed on an analog input signal. In order to generate a bit from the sampled analog input signal, the asynchronous SAR ADC may perform an operation of determining D an output of a comparator after performing an operation of generating G↑ a rising edge of a clock of the comparator (hereinafter referred to as CKC).

In addition, the asynchronous SAR ADC may perform an operation to generate G↓ a falling edge of the CKC after the output of the comparator is determined, and an operation of resetting R the comparator may be performed by the generated falling edge. The asynchronous SAR ADC sequentially determines digital values for each bit by using one comparator, and thus, the operation of resetting R the comparator is essential.

The asynchronous SAR ADC may perform an operation of sampling L the output of the comparator and may perform an operation of setting T a CDAC based on a sampled value.

In addition, the asynchronous SAR ADC may perform the operation of generating G↑ the rising edge of the CKC, to determine the next bit after the comparator is reset.

As described above, the minimum time length Cambria Mathrequired for the asynchronous SAR ADC to complete a conversion process of one bit may be expressed in Equation 1 below.

$$t_{conv,async} \geq t_{c2Q} + \max(t_{CKC,F} + t_{RST} + t_{CKC,R}, t_{latch} + t_{settle}) \quad \text{[Equation 1]}$$

In Equation 1, $t_{c2Q}$ indicates a clock-to-Q delay time of the comparator, and $t_{CKC,F}$ and $t_{CKC,R}$ respectively indicate times required to generate the falling edge and rising edge of the CKC. In addition, in Equation 1, $t_{RST}$ indicates a time required to reset the comparator, $t_{latch}$ indicates a time required to transfer the output of the comparator an input of the CDAC, and $t_{settle}$ indicates a delay time due to a delay of a SAR logic circuit and CDAC settings.

In the case of the asynchronous SAR ADC 1a, bits are sequentially determined, and thus, the delay time according to Equation 1 described above occurs each time bits are determined. Accordingly, bit determination may be delayed. In addition, in order to reduce a time delay, when the comparator is reset before bit determination is completed, there is a problem that the accuracy of analog-to-digital conversion may be reduced because a determination result may be lost.

In addition, the asynchronous SAR ADC performs the operation of resetting the comparator, which may cause noise to occur, and this noise may degrade the performance of analog-to-digital conversion and reduce the accuracy.

Although the asynchronous SAR ADC has the advantage in terms of power consumption and simplicity of implementation, there is a problem that the overall conversion time may relatively increase due to a sequential bit determination process using one comparator.

Figure 3:
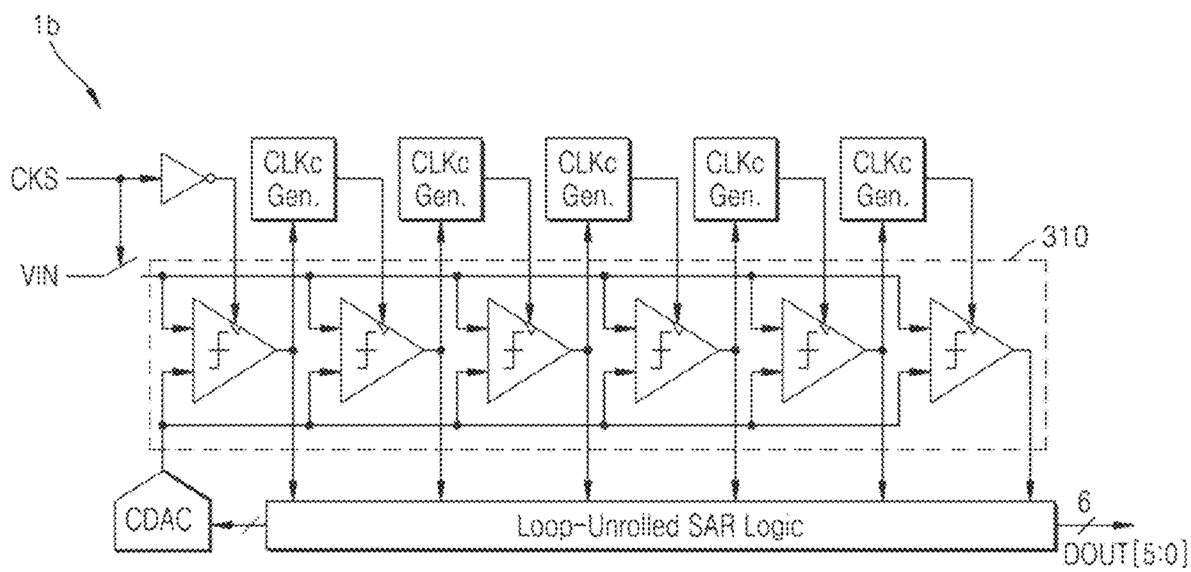
FIG. 3 is a diagram illustrating a structure of a loop-unrolled SAR ADC.

FIG. 3 is a diagram illustrating a structure of a loop-unrolled SAR ADC 1b.

Referring to FIG. 3, the loop-unrolled SAR ADC 1b may include a plurality of comparators 310, unlike the asynchronous SAR ADC described above. The plurality of comparators 310 may each be connected to a corresponding clock generator to identify a falling edge of a CKC or a rising edge of the CKC from a clock generator. In addition, the plurality of comparators 310 may be connected to a CDAC.

As described above with reference to FIGS. 1 and 2, as one comparator is included in the asynchronous SAR ADC, a loop that repeatedly determines a bit at each bit position is used to determine the bit, which increases the time of the entire conversion process due to the time required to reset the comparator.

In the case of a loop-unrolled SAR ADC 1b, a process of resetting the comparator is not required, which may significantly reduce the time required for analog-to-digital conversion. That is, the loop-unrolled SAR ADC 1b shown in FIG. 3 may operate in an unfolded loop by using a predetermined clock period and bit determination circuit. This allows the loop-unrolled SAR ADC 1b to determine multiple bits within a single clock period, which has the advantage of reducing the overall conversion time.

Figure 4:
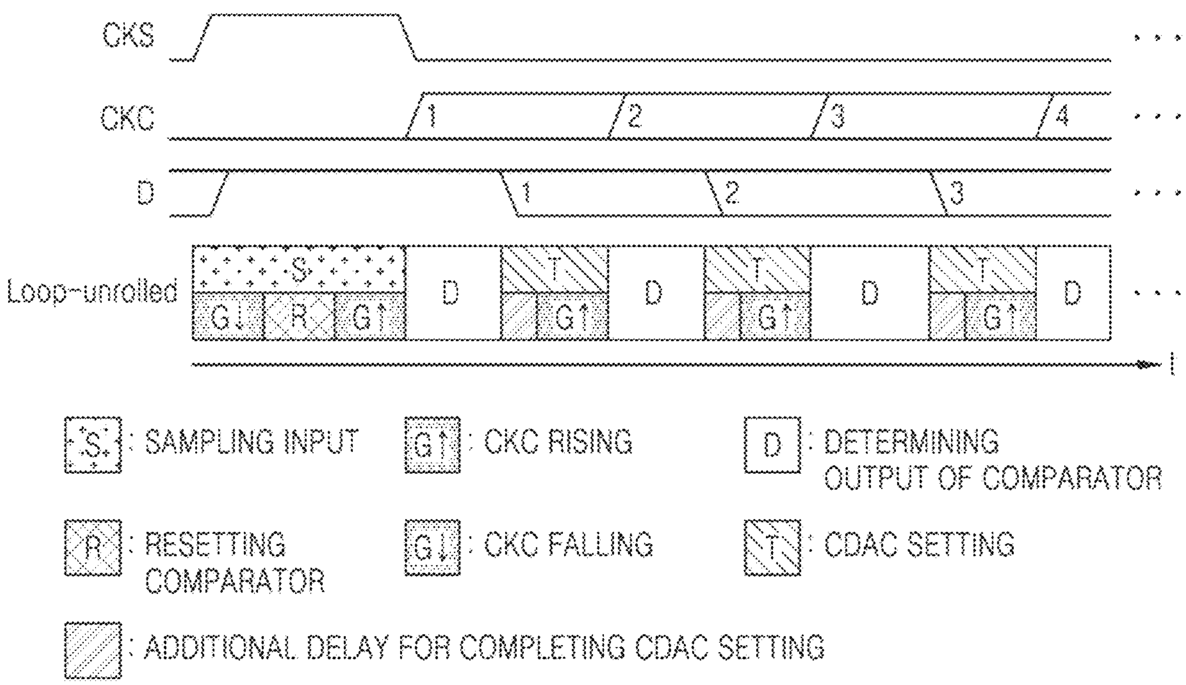
FIG. 4 is a diagram illustrating an operation process of a loop-unrolled SAR ADC over time.

FIG. 4 is a diagram illustrating an operation process of a loop-unrolled SAR ADC over time.

Referring to FIG. 4, in the case of the loop-unrolled SAR ADC, a process of determining a first bit is the same as that in the asynchronous SAR ADC described with reference to FIG. 2. However, the loop-unrolled SAR ADC includes a plurality of comparators, and one comparator is used to determine one bit, and thus, a process of generating each bit may not include an operation of resetting the comparator and an operation of generating a falling edge of a clock of the comparator.

In other words, the loop-unrolled SAR ADC may perform an operation of generating G↑ a rising edge of a CKC and an operation of setting T a CDAC after an output of the comparator is determined. This process may be repeatedly performed until the least significant bit (LSB) is determined, and the comparators may be reset after analog-to-digital conversion processes of all the comparators are completed.

As described above, the minimum time length $t_{conv,loop\text{-}unrolled}$ required for the loop-unrolled SAR ADC to complete a conversion process of one bit may be expressed in Equation 2 below.

$$t_{conv,loop\_unrolled} \geq t_{c2Q} + \max(t_{CKC,R}, t_{settle}) \quad \text{[Equation 2]}$$

In Equation 2, $t_{CKC,R}$ indicates the time required to generate the rising edge of the CKC. In addition, in Equation 2, <<mth3>> indicates the delay time due to a delay of a SAR logic circuit and CDAC settings.

Accordingly, the loop-unrolled SAR ADC has the advantage of reducing a bit generation time and increasing an operation speed compared to the asynchronous SAR ADC.

Meanwhile, in Equation 2, a value of $t_{settle}$ is generally greater than a value of $t_{CKC,R}$. Accordingly, the time required for the loop-unrolled SAR ADC to perform bit conversion is mainly affected by the delay time due to the delay of the SAR logic circuit and the CDAC settings.

The ADC using a plurality of DACs according to an embodiment of the disclosure may reduce the time required for the analog-to-digital conversion process by reducing the delay time due to the CDAC settings.

The ADC according to an embodiment may include a plurality of comparators, a plurality of DACs each configured to generate a reference voltage, and a switch circuit configured to connect one DAC among the plurality of DACs to an n+1 comparator, based on a digital value output from an n comparator among the plurality of comparators, and the n+1 comparator may output a digital value based on a result of comparing the reference voltage of one DAC among the plurality of DACs with an input voltage. In addition, the ADC according to the above embodiment may further include a logic circuit configured to sample a digital value output from an n−1 comparator among the plurality of comparators, and the plurality of DACs may each generate the reference voltage, based on the sampled digital value.

Hereinafter, the ADC using the plurality of DACs according to an embodiment will be described in detail with reference to FIGS. 5 to 8, assuming that the plurality of DACs are a plurality of CDACs.

Figure 5:
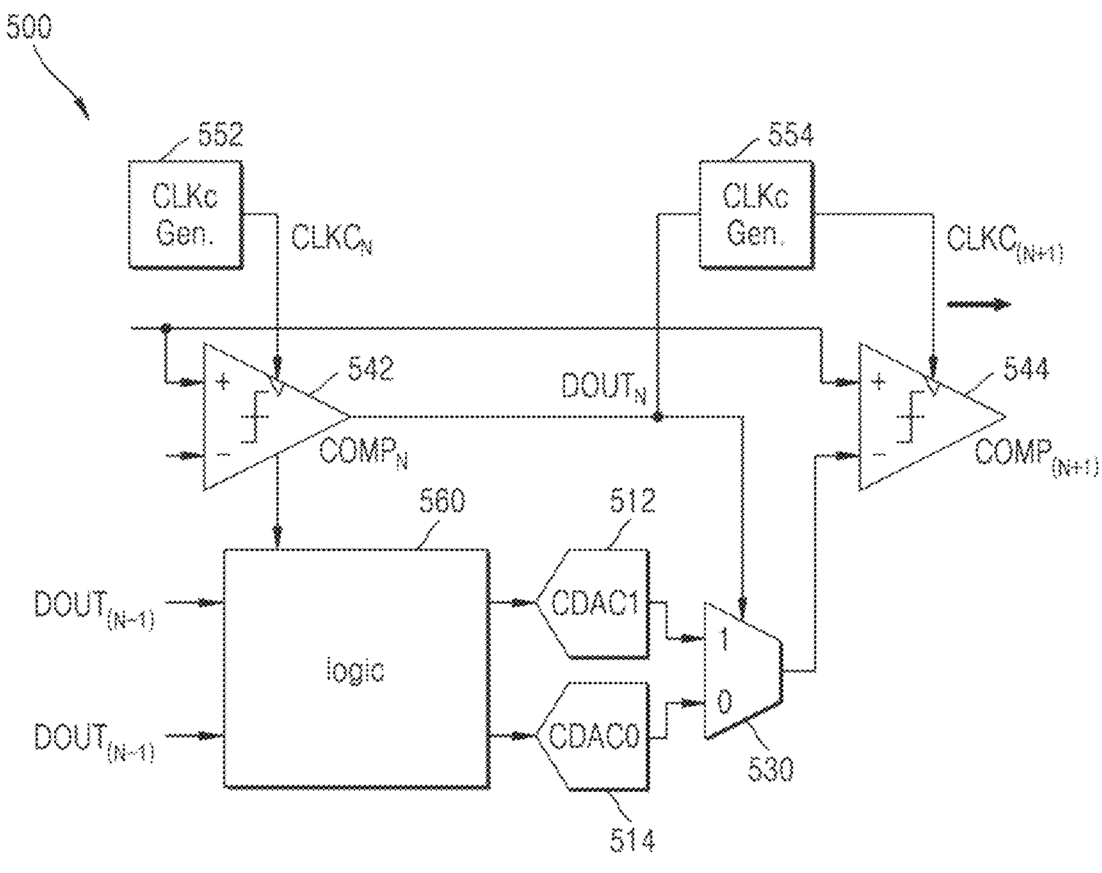
FIG. 5 is a diagram illustrating a structure of an ADC using a plurality of capacitor digital-to-analog converters (CDACs) according to an embodiment.

FIG. 5 is a diagram illustrating a structure of an ADC 500 using a plurality of CDACs 512 and 514 according to an embodiment.

An operation of a CDAC described below may be implemented in the same way through a different type of DAC other than the CDAC. For example, a split capacitor-based DAC, a Vcm-based DAC, a Hybrid R-C DAC, etc. may be used, but this is also an example and the DAC according to the disclosure is not limited to the above-described example. The embodiment of the ADC according to the disclosure may include even implementing the plurality of CDACs, which will be described below, by replacing the plurality of CDACs with the DACs according to the above example. Hereinafter, for convenience of description, the ADC 500 using the plurality of CDACs 512 and 514 is described.

The ADC 500 according to an embodiment may include a first CDAC 512 and a second CDAC 514 each generating and outputting a reference voltage to be compared with an input voltage, and an n comparator $COMP_N$ 542 and an n+1 comparator $COMP_{(N+1)}$ 544 receiving the input voltage and the reference voltage output by the CDAC (e.g., 512), and comparing the input voltage with the reference voltage, and outputting a digital value. The plurality of comparators 542 and 544 may be respectively connected to a plurality of clock generators 552 and 554 generating a CKC rising edge or a CKC falling edge. However, this is only an example, and the plurality of comparators 542 and 544 may be connected to at least one clock generator. The CKC rising edge means that a signal generated by a clock generator changes from state 0 to state 1, and the CKC falling edge means that the signal generated by the clock generator changes from state 1 to state 0.

In addition, the ADC 500 may include a logic circuit 560 storing the digital value output by the comparator (e.g., an n−1 comparator) and transferring the stored digital value to the CDAC (e.g., 512), and a switch circuit 530 transferring one of the reference voltages generated by the plurality of CDACs 512 and 514 to a next comparator.

The plurality of CDACs 512 and 514 may include the first CDAC 512 generating and outputting the reference voltage when a digital value output by the n comparator $COMP_N$ 542 is 1, and the second CDAC 514 generating and outputting the reference voltage when the digital value output by the n comparator $COMP_N$ 542 is 0. However, this is only an example, and the reference voltages generated by the first CDAC 512 and the second CDAC 514 are not limited to the above-described example. According to another example, the first CDAC 512 may generate the reference voltage when the digital value output by the n comparator $COMP_N$ 542 is 0, and the second CDAC 514 may generate the reference voltage when the digital value output by the n comparator $COMP_N$ 542 is 1. At this time, the plurality of CDACs 512 and 514 generate the reference voltages before the n comparator $COMP_N$ 542 outputs the digital value. The first CDAC 512 and the second CDAC 514 may be connected to each other in parallel.

The switch circuit 530 may be configured to select one of the first CDAC 512 and the second CDAC 514 connected to each other in parallel. For example, the switch circuit 530 may select either the first CDAC 512 or the second CDAC 514 based on the digital value output by the n comparator $COMP_N$ 542 and connect the selected first CDAC 512 or second CDAC 514 to the n+1 comparator $COMP_{(N+1)}$ 544 which is a comparator of a next step.

When either the first CDAC 512 or the second CDAC 514 is selected by the switch circuit 530, the reference voltages previously generated by the first CDAC 512 and the second CDAC 514 may be input to the n+1 comparator $COMP_{(N+1)}$ 544 and compared with the input voltage.

In the disclosure, the n comparator $COMP_N$ 542 may be a comparator operating in the current step, the n−1 comparator may be a comparator operating in a step previous to the current step, and the n+1 comparator $COMP_{(N+1)}$ 544 may be a comparator operating in a step subsequent to the current step.

In addition, the logic circuit 560 may sample the digital value output by the n−1 comparator in the previous step when a clock generator (e.g., 552) generates a rising edge of a clock $CLKC_{(N)}$ with respect to the n comparator $COMP_N$ 542 and then the n comparator $COMP_N$ 542 operates. The first CDAC 512 and the second CDAC 514 may predict an output value of the n comparator $COMP_N$ 542 in the current step, based on the digital value sampled by the logic circuit 560 and generate the reference voltage of the n+1 comparator $COMP_{(N+1)}$ 544 in the next step.

The logic circuit 560 according to an embodiment may include a storage unit that stores the sampled digital value, and the storage unit may be connected to a plurality of SAR logic circuits.

Figure 6:
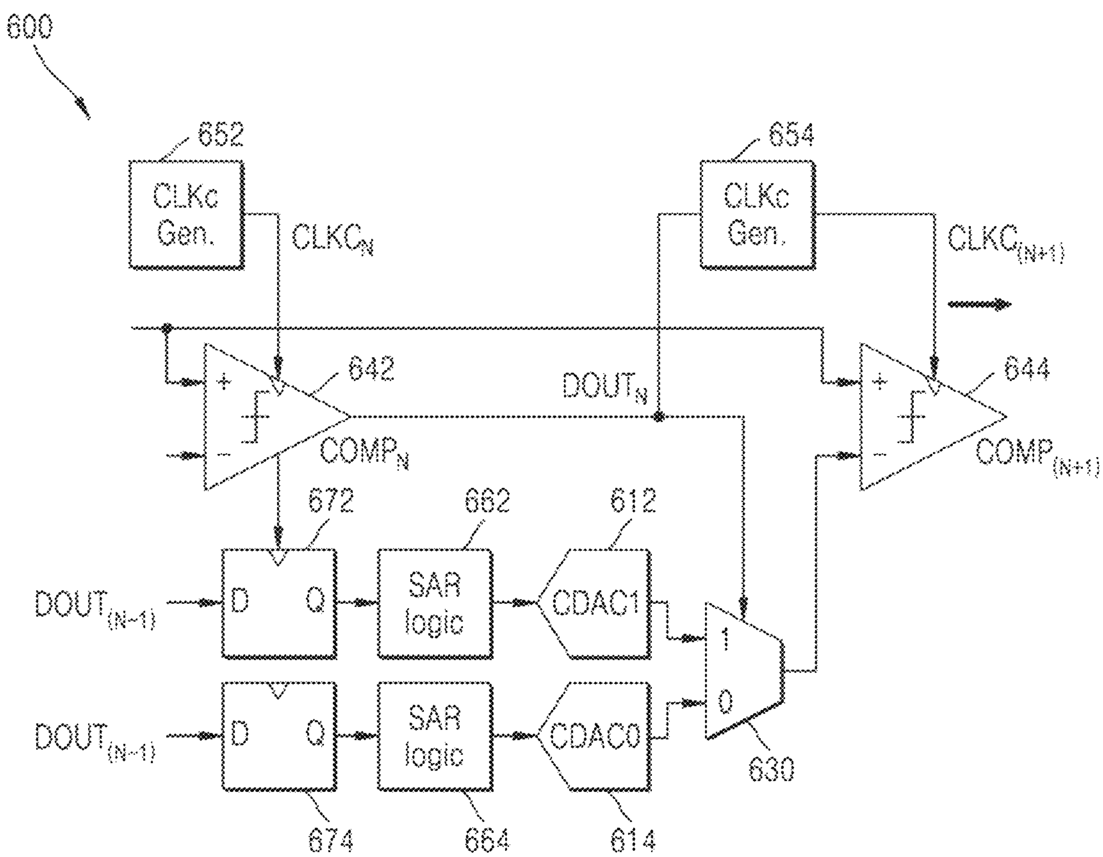
FIG. 6 is a diagram illustrating a detailed structure of an ADC using a plurality of CDACs according to an embodiment.

FIG. 6 is a diagram illustrating a detailed structure of an ADC 600 using a plurality of CDACs 612 and 614 according to an embodiment.

Referring to FIG. 6, the ADC 600 may include a first CDAC 612 and a second CDAC 614 and an n comparator $COMP_N$ 642 and an n+1 comparator $COMP_{N+1}$ 644 receiving an input voltage and reference voltages output by the first CDAC 612 and the second CDAC 614, comparing the input voltage with the reference voltages, and outputting digital values. The plurality of comparators 642 and 644 may be respectively connected to a plurality of clock generators 652 and 654 generating a CKC rising edge or a CKC falling edge.

In addition, the ADC 600 may include a first flip-flop circuit 672 and a second flip-flop circuit 674 that store digital values output by an n−1 comparator. The plurality of flip-flop circuits 672 and 674 may be respectively connected to a first SAR logic circuit 662 and a second SAR logic circuit 664. The first SAR logic circuit 662 may transfer the digital value stored in the first flip-flop circuit 672 to the first CDAC 612. In addition, the second SAR logic circuit 664 may transfer the digital value stored in the second flip-flop circuit 674 to the second CDAC 614.

When receiving the digital value output by the n−1 comparator through the first SAR logic circuit 662, the first CDAC 612 may previously generate a first reference voltage before an output of the n comparator $COMP_N$ 642 is determined. For example, the first reference voltage may be a reference voltage when the output of the n comparator $COMP_N$ 642 is 0. In addition, when receiving the digital value output by the n−1 comparator through the second SAR logic circuit 664, the second CDAC 614 may previously generate a second reference voltage before the output of the n comparator $COMP_N$ 642 is determined. For example, the second reference voltage may be a reference voltage when the output of the n comparator $COMP_N$ 642 is 1. When the output of the n comparator $COMP_N$ 642 is determined, a switch circuit 630 may connect the first CDAC 612 or the second CDAC 614 to the n+1 comparator $COMP_{N+1}$ 644 based on the output of the n comparator $COMP_N$ 642. Accordingly, when the output of the n comparator $COMP_N$ 642 is 0, the first reference voltage may be input to the n+1 comparator 644, and when the output of the n comparator $COMP_N$ 642 is 1, the second reference voltage may be input to the n+1 comparator $COMP_{N+1}$ 644.

Figure 7:
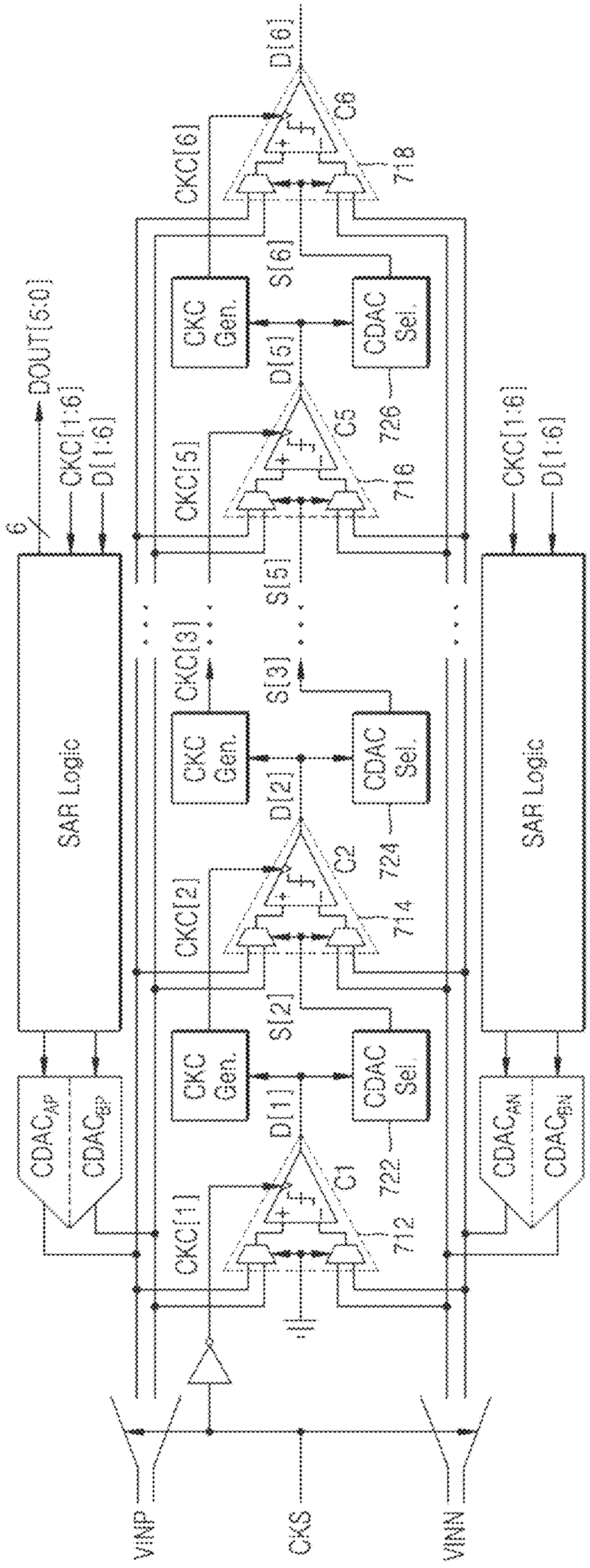
FIG. 7 is a diagram for explaining a 6-bit ADC using a plurality of CDACs according to an embodiment.

FIG. 7 is a diagram for explaining a 6-bit ADC using a plurality of CDACs according to an embodiment.

In the embodiment of FIG. 7, it is assumed that a differential signal is input as an analog input signal. The 6-bit ADC using the plurality of CDACs according to an embodiment may include a bootstrapped sampling switch, a plurality of comparators (e.g., 712, 714, 716, and 718), a clock CLK generator with respect to each of the plurality of comparators 712, 714, 716, and 718, two differential CDACs $CDAC_{PA}/CDAC_{NA}$ and $CDAC_{PB}/CDAC_{NB}$, and a plurality of switch circuits (e.g., 722, 724, and 726) selecting one of the two differential CDACs $CDAC_{PA}/CDAC_{NA}$ and $CDAC_{PB}/CDAC_{NB}$ and transferring a reference signal.

The two differential CDACs $CDAC_{PA}/CDAC_{NA}$ and $CDAC_{PB}/CDAC_{NB}$ according to an embodiment may set reference voltages when an output of a comparator is 0 and 1 before the output of the comparator in the current step is determined. For example, before the output of the second comparator 714 is determined, based on a digital value sampled from the first comparator 712, the two differential CDACs $CDAC_{PA}/CDAC_{NA}$ and $CDAC_{PB}/CDAC_{NB}$ may each generate a first reference voltage and a second reference voltage to be input to the third comparator 716. The first reference voltage may be a reference voltage when the output of the second comparator 714 is 0, and the second reference voltage may be a reference voltage when the output of the second comparator 714 is 1.

When the output of the second comparator 714 is determined, the second switch circuit 724 may connect the differential CDAC $CDAC_{PA}/CDAC_{NA}$ or $CDAC_{PB}/CDAC_{NB}$, to the third comparator 716, generating the reference voltage corresponding to the determined output among two differential CDACs $CDAC_{PA}/CDAC_{NA}$ and $CDAC_{PB}/CDAC_{NB}$.

The 6-bit ADC using the plurality of CDACs according to an embodiment may generate the reference voltages of the CDACs before the outputs of the comparators in the current step are determined, thereby reducing the time required to set the reference voltages of the CDACs.

Hereinafter, the operation of an ADC using a plurality of CDACs over time is described in more detail with reference to FIG. 8.

Figure 8:
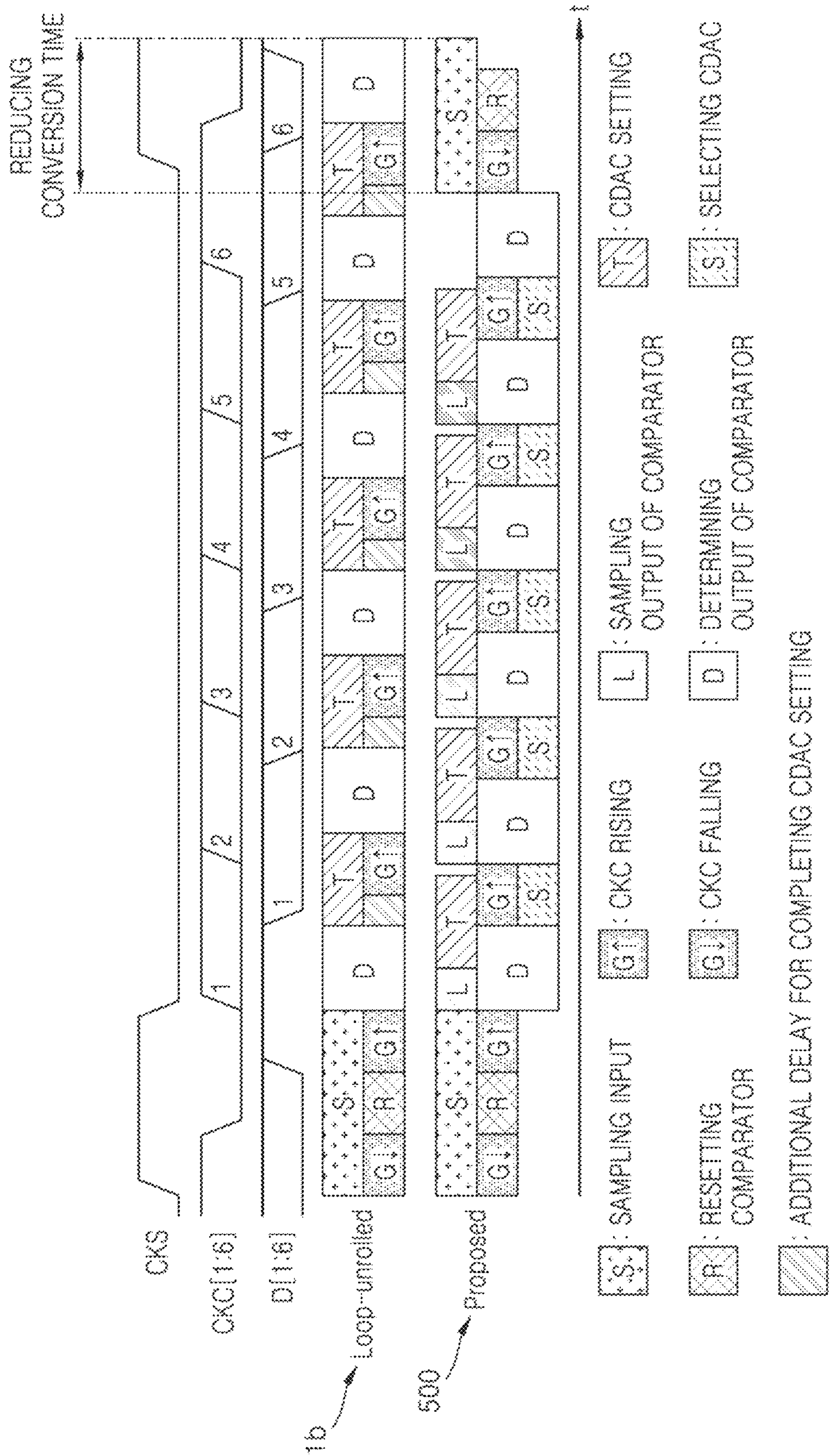
FIG. 8 is a diagram illustrating a comparison between an operation process of a loop-unrolled SAR ADC and an operation process of an ADC using a plurality of CDACs over time according to an embodiment.

FIG. 8 is a diagram illustrating a comparison between an operation process of the loop-unrolled SAR ADC 1b and an operation process of the ADC 500 using the plurality of CDACs 512 and 514 over time according to an embodiment.

The embodiment of FIG. 8 is described on the assumption of the operations of the loop-unrolled SAR ADC 1b described above with reference to FIG. 3 and the ADC 500 using the plurality of CDACs 512 and 514 according to the embodiment described above with reference to FIG. 5.

A CDAC uses a combination of capacitors to generate an analog voltage according to a digital code. An output voltage of the CDAC may be determined by setting of capacitors (hereinafter referred to as CDAC setting) constituting the CDAC. In addition, the operation of CDAC described below may be implemented in the same way through a different type of DAC other than the CDAC. For example, a split capacitor-based DAC, a Vcm-based DAC, a Hybrid R-C DAC, etc. may be used, but this is also an example and the DAC according to the disclosure is not limited to the above-described example. The embodiment of the ADC according to the disclosure may include even implementing the plurality of CDACs, which will be described below, by replacing the plurality of CDACs with the DACs according to the above example. Hereinafter, for convenience of description, the ADC using the plurality of CDACs is described.

In a CDAC setting process, the ADC sets the capacitors of the CDAC based on a digital value of the corresponding bit at each bit position. In the CDAC setting, an output voltage of the CDAC may be adjusted by accumulating or discharging charges in or from the capacitors. Therefore, the capacitors need to be set proportionally according to the digital value of each bit position.

Typically, the CDAC is set using a binary-weighted code. That is, the capacitors are set according to the weight of a bit. A capacitor of the most significant bit (MSB) may be set with the largest weight, and a capacitor of a less bit may be set with a small weight.

Setting of the CDAC is an important process to generate an accurate analog voltage of an input signal and a reference signal to be compared. Therefore, the capacitors of the CDAC need to be set appropriately according to a digital code to generate the analog voltage that matches the input signal. The output voltage of the CDAC may be determined according to a combination of set capacitors, and the output voltage of the CDAC set in a previous step may be referenced in a next bit determination step.

When a rising edge of a clock with respect to the n comparator $COMP_N$ 542 in the current step is generated G↑, an operation of determining D an output of the n comparator $COMP_N$ 542 in the current step may immediately begin.

At the same time, the logic circuit 560 may sample L a digital value $DOUT_{(N-1)}$ output by an n−1 comparator in a previous step.

Based on the sampled value, the first CDAC 110 and the second CDAC 120 may perform setting T of the CDAC before the operation of determining D the output of the n comparator $COMP_N$ 542 in the current step is completed. In the setting T of the CDAC, when digital values output by the n comparator $COMP_N$ 542 in the current step are 1 and 0, reference voltages input to the n+1 comparator $COMP_{(N+1)}$ 544 in a the required next step may be respectively generated.

In other words, the first CDAC 110 may generate the reference voltage corresponding to the required value when the digital value output by the n comparator $COMP_N$ 542 in the current step is 1, and the second CDAC 120 may previously generate the reference voltage corresponding to the required value when the digital value output by the n comparator $COMP_N$ 542 in the current step is 0.

Thereafter, when the digital value output by the n comparator $COMP_N$ 542 in the current step is actually determined, either the first CDAC 110 or the second CDAC 120 may be selected S based on the digital value output by the n comparator $COMP_N$ 542 in the current step.

For example, when the CDAC selected based on the n comparator $COMP_N$ 542 in the current step is the first CDAC 512, the reference voltage output by the first CDAC 512 may be transferred as an input of the n+1 comparator $COMP_{(N+1)}$ 544 in the next step, and a clock $CLKC_{(N+1)}$ for the n+1 comparator $COMP_{(N+1)}$ 544 in the next step may be generated.

According to another example, when the CDAC selected based on the actual output digital value of the n comparator $COMP_N$ 542 in the current step is the second CDAC 514, the reference voltage output by the second CDAC 514 may be transferred as the input of the n+1 comparator $COMP_{(N+1)}$ 544 in the next step, and the clock $CLKC_{(N+1)}$ for the n+1 comparator $COMP_{(N+1)}$ 544 in the next step may be generated In addition, the logic circuit 560 may undergo a series of approximation processes according to bits. The bits may be sequentially identified, and the logic circuit 560 may operate with the n comparator $COMP_N$ 542 to identify an approximate value of a bit at the current step, and based on the identified approximate value, determine the approximation of a next bit. Accordingly, the bits may be sequentially determined, and the logic circuit 560 may repeatedly perform a process of identifying the approximate value.

The logic circuit 560 may include a plurality of SAR logic circuits to be connected to the first CDAC 110 and the second CDAC 120, respectively. However, the configuration of the logic circuit 560 may not be limited thereto.

The ADC 500 using the plurality of CDACs 512 and 514 according to an embodiment may begin setting the CDAC before the digital value output by the n comparator $COMP_N$ 542 in the current step is determined.

In other words, the ADC 500 using the plurality of CDACs 512 and 514 according to an embodiment may predict an output value of the n comparator $COMP_N$ 542 in the current step, before the digital value output by the n comparator $COMP_N$ 542 in the current step is determined, to previously generate the reference voltage output by the CDAC by utilizing the plurality of CDACs 512 and 514.

Thereafter, when the digital value output by the n comparator $COMP_N$ 542 in the current step is determined, the ADC 500 using the plurality of CDACs 512 and 514 may perform only the process of selecting the CDAC, thereby implementing an operation speed of a circuit as quickly as possible.

Therefore, unlike the loop-unrolled SAR ADC 1b described above with reference to FIGS. 3 and 4, the operation of CDAC setting T and the operation of determining D the output of the n comparator $COMP_N$ 542 in the current step may overlap, which may remove the time to unnecessarily stand by the CDAC setting before a rising edge of the clock $CLKC_{(N+1)}$ for the n+1 comparator $COMP_{(N+1)}$ 544 in the next step is generated.

As shown in FIG. 8, when comparing the conversion time of the loop-unrolled SAR ADC 1b with that of the ADC 500 using the plurality of CDACs 512 and 514 according to an embodiment, in general, the time required for the CDAC setting T increases compared to the time required for generating G the rising edge of a clock generator.

When the rising edge of the clock generator is generated while the CDAC setting is not completed, there is a problem that an error may occur in a comparison result.

Therefore, in order to ensure that the time required for completing the CDAC setting is later than the time required for generating the rising edge of the clock generator, the loop-unrolled SAR ADC 1b adds a time delay operation (a shaded square in FIG. 8) to an operation of generating the rising edge of the clock generator. This time delay operation may be implemented by placing a delay structure such as a buffer before the clock generator (e.g., 554).

However, this time delay operation increases the time required to determine a value of one bit and, as a result, becomes a factor limiting the overall operation speed of analog-to-digital conversion.

On the other hand, n ADC using a plurality of CDACs according to an embodiment does not reduce the time required for the CDAC setting but sets the time when the CDAC setting starts as the time before the digital value output by the comparator (e.g., 542) is completely determined, thereby removing the time delay operation required by the loop-unrolled SAR ADC 1b.

Therefore, the ADC 500 using the plurality of CDACs 512 and 514 according to an embodiment may achieve conversion time reduction by a part indicated by the arrow as shown in FIG. 8, thereby quickly improving the overall operation speed of analog-to-digital conversion.

In addition, in the ADC 500 using the plurality of CDACs 512 and 514 according to an embodiment, the operation of selecting the CDAC based on the digital value output by the n comparator $COMP_N$ 542 in the current step is performed simultaneously with the operation of generating the rising edge of the clock generator in the next step, and thus, the conversion speed of the entire circuit may not slow down even though the operation of selecting the CDAC is added.

In other words, unlike the loop-unrolled SAR ADC 1b, the ADC 500 using the plurality of CDACs 512 and 514 according to an embodiment, the operation of generating the output of the comparator (e.g., 542) and the CDAC setting operation do not need to be sequentially performed, and thus, the overall operation time may be reduced.

The ADC 500 using the plurality of CDACs 512 and 514 according to an embodiment may start CDAC setting before the output value of the n comparator $COMP_N$ 542 in the current step is determined, thereby reducing the overall cycle time.

The ADC 500 using the plurality of CDACs 512 and 514 according to an embodiment presets reference voltages for the n+1 comparator $COMP_{N+1}$ 544 in the next step according to an expected output value of the n comparator $COMP_N$ 542 in the current step, when the output value of the n comparator $COMP_N$ 542 in the current step is determined, selects one of the set reference voltages and determines the selected reference voltage as the reference voltage of the n+1 comparator $COMP_{N+1}$ 544 in the next step, thereby starting CDAC setting before the output value of the n comparator $COMP_N$ 542 in the current step is determined.

The ADC 500 using the plurality of CDACs 512 and 514 according to an embodiment may not only increase the operation speed of a single-channel SAR ADC, but also reduce the number of sub-ADCs of a time-interleaving ADC configured by time-interleaving multiple single-channel ADCs, and reducing the complexity and power consumption of the circuit that generates sampling clocks of the sub-ADCs.

An ADC using a plurality of DACs according to an embodiment may start DAC setting before a current comparator output value is determined, thereby reducing the cycle time of analog-to-digital conversion.

The ADC using the plurality of DACs according to an embodiment may preset a next comparator input voltage according to an expected current comparator output value, when the output value of the current comparator is determined, select one of set input voltages, and determine the selected input voltage as an input voltage of a next comparator, thereby starting DAC setting before the comparator output value is determined.

The ADC using the plurality of DACs according to an embodiment may not only increase the operation speed of a single-channel SAR ADC, but also reduce the number of sub-ADCs of a time-interleaving ADC configured by time-interleaving multiple single-channel ADCs, thereby reducing the complexity and power consumption of a circuit that generates sampling clocks of sub-ADCs.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An analog-to-digital converter (ADC) using a plurality of capacitor digital-to-analog converters (CDACs), the ADC comprising:

a plurality of comparators including a first comparator and a second comparator;

a plurality of CDACs each configured to generate a reference voltage; and a switch circuit configured to connect one CDAC among the plurality of CDACs to the first comparator, based on a digital value output from the second comparator, wherein the first comparator is configured to output a digital value based on a result of comparing the reference voltage of one CDAC among the plurality of CDACs with an input voltage, and the first comparator is a comparator operating in a step subsequent to a current step and the second comparator is a comparator operating in the current step.

2. The ADC of claim 1, further comprising: a logic circuit configured to sample a digital value output from a third comparator among the plurality of comparators, wherein the plurality of CDACs are each configured to generate the reference voltage, based on the sampled digital value, and the third comparator is a comparator operating in a step previous to the current step.

3. The ADC of claim 2, wherein the logic circuit includes a plurality of successive approximation register (SAR) logic circuits, and the plurality of SAR logic circuits are configured to sample the digital value output from the third comparator, and transfer the sampled digital value to the plurality of CDACs respectively connected to the plurality of SAR logic circuits.

4. The ADC of claim 3, wherein the logic circuit includes a storage unit storing the sampled digital value, and the storage unit is connected to the plurality of SAR logic circuits.

5. The ADC of claim 3, wherein the plurality of CDACs include a first CDAC configured to generate a first reference voltage when the digital value output from the second comparator is expected to be 1, based on the sampled digital value; and a second CDAC configured to generate a second reference voltage when the digital value output from the second comparator is expected to be 0, based on the sampled digital value.

6. The ADC of claim 5, wherein the switch circuit is configured to transfer the first reference voltage of the first CDAC to the first comparator when the digital value output from the second comparator is 1, and transfer the second reference voltage of the second CDAC to the first comparator when the digital value output from the second comparator is 0.

7. The ADC of claim 1, wherein the plurality of CDACs are configured to generate respective reference voltages before the digital value is output from the second comparator.

8. The ADC of claim 1, wherein the plurality of CDACs are connected to each other in parallel.

9. The ADC of claim 1, further comprising: at least one clock generator configured to generate a clock with respect to each of the plurality of comparators.

10. An analog-to-digital converter (ADC) using a plurality of capacitor digital-to-analog converters (CDACs), the ADC comprising:

a plurality of comparators including a first comparator, a second comparator and a third comparator;

a first CDAC configured to generate a first reference voltage based on a digital value output from a third comparator among the plurality of comparators;

a second CDAC configured to generate a second reference voltage based on the digital value output from the third comparator among the plurality of comparators; and a switch circuit configured to connect the first CDAC or the second CDAC to a first comparator based on a digital value output from the second comparator among the plurality of comparators, wherein the first comparator is configured to output a digital value based on a result of comparing the first reference voltage or the second reference voltage with an input voltage, the first comparator is a comparator operating in a step subsequent to a current step, the second comparator is a comparator operating in the current step and the third comparator is a comparator operating in a step previous to the current step.

11. The ADC of claim 10, further comprising: a logic circuit configured to sample the digital value output from the third comparator, wherein the first reference voltage or the second reference voltage is generated based on the sampled digital value.

12. The ADC of claim 10, wherein the switch circuit is configured to transfer the first reference voltage of the first CDAC to the first comparator when the digital value output from the second comparator is 1, and transfer the second reference voltage of the second CDAC to the first comparator when the digital value output from the second comparator is 0.

13. The ADC of claim 10, wherein the first CDAC is configured to generate the first reference voltage, and the second CDAC is configured to generate the second reference voltage before the digital value is output from the second comparator.

14. The ADC of claim 10, wherein the first CDAC and the second CDAC are connected to each other in parallel.

* * * * *